United States Patent [19]

Hasegawa

[11] Patent Number: 4,742,023

[45] Date of Patent: May 3, 1988

[54] METHOD FOR PRODUCING A SEMICONDUCTOR DEVICE

[75] Inventor: Hitoshi Hasegawa, Tama, Japan

[73] Assignee: Fujitsu Limited, Kawasaki, Japan

[21] Appl. No.: 86,805

[22] Filed: Aug. 19, 1987

[30] Foreign Application Priority Data

Aug. 28, 1986 [JP] Japan .................. 61-203035
Aug. 28, 1986 [JP] Japan .................. 61-200101

[51] Int. Cl.⁴ .................. H01L 21/60; H01L 21/92
[52] U.S. Cl. .................. 437/183; 437/203;
437/245; 437/246; 437/189; 437/190; 437/192;
156/664; 357/68; 357/67; 357/71
[58] Field of Search ........... 437/183, 190, 192, 203,
437/245; 156/664; 357/68, 67

[56] References Cited

U.S. PATENT DOCUMENTS

| | | | |
|---|---|---|---|
| 3,458,925 | 8/1969 | Napier et al. | 357/68 |
| 3,462,349 | 8/1969 | Gorgenyi | 357/68 |
| 3,585,713 | 6/1971 | Kaneda et al. | 357/68 |
| 3,686,698 | 8/1972 | Akeyama et al. | 357/68 |
| 3,689,332 | 9/1972 | Dietrich et al. | 357/68 |
| 3,761,309 | 9/1973 | Schmitter et al. | 357/68 |
| 3,821,785 | 6/1974 | Rose | 357/68 |

FOREIGN PATENT DOCUMENTS 56-33857 4/1981 Japan .
57-734347 2/1982 Japan .
60-32335 6/1985 Japan .

Primary Examiner—Brian E. Hearn
Assistant Examiner—Beverly A. Pawlikowski
Attorney, Agent, or Firm—Staas & Halsey

[57] ABSTRACT

A method for producing a semiconductor device comprises the steps of: forming an insulating layer on a semiconductor substrate provided with an electrode portion thereon, forming a barrier metal layer over the entire surface thereof, forming a groove in the barrier metal layer so that the groove surrounds the electrode portion, burying a stopper material in the groove, forming a bump on the barrier metal layer positioned on the electrode portion, and removing the barrier metal layer outside of the stopper. The stopper prevents the removal of the inside barrier metal layer during the removal of the outside barrier metal layer.

9 Claims, 9 Drawing Sheets

Fig. ID  PRIOR ART
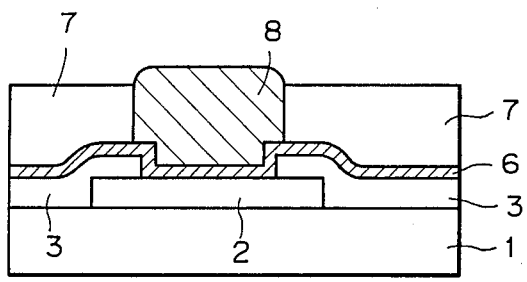
Fig. IE  PRIOR ART
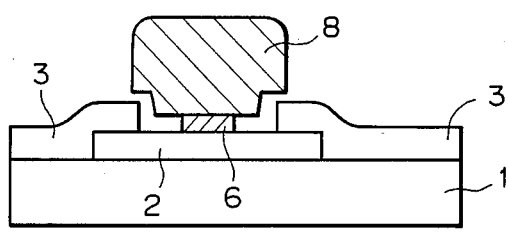

METHOD FOR PRODUCING A SEMICONDUCTOR DEVICE

BACKGROUND OF THE INVENTION

1. Field of the Invention

The present invention relates to a method for producing a semiconductor device. More particularly, it relates to a method for producing a semiconductor device having a metal bump which is used as a terminal electrode thereof.

2. Description of the Related Art

The terminal electrodes of a semiconductor device are usually formed by, for example, an Au wire terminal electrode. However, the electrode structure wherein a large projected metal (bump) is adhered to the electrode portion of the semiconductor device, and wires are connected to the projected metal, is known.

Since the semiconductor device having the bump does not require wire bonding, the thickness of the package of the semiconductor device is reduced and the size of the bonding pad (electrode region) of a semiconductor chip is made considerably smaller. Accordingly, a semiconductor device having a bump has an advantage in that it can be assembled in an IC card in a flat shape package and the size of the semiconductor device per se is considerably reduced. Further, since a composite device is formed by providing a plurality of semiconductor chip electric circuits, it can be packaged with a high degree of density. Nevertheless, the metal bump per se must have a good adhesion to an electrode.

FIGS. 1A to 1E are cross-sectional views explaining a conventional method for providing the above-mentioned device.

As shown in FIG. 1A, an aluminum electrode 2 is provided on a semiconductor substrate 1 and a phosphosilicate glass (PSG) film 3 is formed over the substrate 1 and the aluminum electrode 2 by a chemical vapour deposition (CVD) process. A silicon dioxide ($SiO_2$) film may be used instead of the PSG film 3.

Then, as shown in FIG. 1B, a first resist film is coated on the PSG film 3, and exposed and developed to form a first resist pattern 4 having an opening at a required position above the electrode 2. The PSG film 3 is then etched, using the resist film pattern 4 as a mask, so that an opening 5 is formed above the electrode 2.

The resist film pattern 4, is then removed, as shown in FIG. 1C, and a barrier metal film 6 about 3 $\mu$m thick and consisting of three layers of titanium (Ti), copper (Cu), and nickel (Ni) respectively, is formed on the exposed PSG film 3 and electrode 2 by a sputtering process.

Then, as shown in FIG. 1D, a second resist film is coated on the barrier metal film 6, and exposed and developed so that a second resist film pattern 7 having an opening larger than the opening 5 is formed at the opening 5. Then, a solder (PbSn) bump 8 is formed at the opening 5 by a plating method using the resist film pattern 7 as a mask. During the plating, the barrier metal film 6 is used as a plating conductive layer.

Then, as shown in FIG. 1E the resist film pattern 7 and the exposed barrier metal film 6 are removed, using the solder bump electrode 8 as a mask, by a wet etching method using a mixture of nitric acid and phosphoric acid to remove the nickel and copper, and phosphoric acid to remove the titanium. The wet etching method is used because a dry etching will cause the bump electrode to be easily etched.

Subsequently, the solder bump is melted by a heat treatment to form a semi-spherical bump 8 having a diameter of about 150 $\mu$m. A gold (Au) bump may be formed instead of the solder bump, by a method similar to the above-mentioned process.

In the above mentioned method for forming the bump 8, the barrier metal film 6 is interposed between the electrode 2 and the bump 8 so that the bump 8 does not react with the electrode 2. Also the barrier metal film 6 is used as a plating conductive layer, as explained above.

In the etching of the barrier metal film 6 using the solder bump 8 as a mask, a side etching is carried out in a lower portion of the bump 8 as shown in FIG. 1D, since in the lower portion of the bump, the flow of the olating liquid becomes uneven and a battery is formed by the bump 8 and the barrier metal films 6. This deteriorates the adhesive properties between the bump 8 and the aluminum electrode 2, and the bump 8 can be easily separated from the etched barrier metal film 6.

SUMMARY OF THE INVENTION

An object of the present invention is to provide a method for producing a semiconductor device wherein a bump is firmly connected to an electrode or wiring.

A further object of the present invention is to provide a method for producing a semiconductor device having a bump, with an improved reliability.

According to the present invention there is provided a method for producing a semiconductor device comprising the steps of:

forming an insulating layer on a semiconductor substrate provided with an electrode portion thereon, forming a barrier metal layer over the entire surface thereof, forming a groove in the barrier metal layer so that the groove surrounds the electrode portion, burying a stopper material in the groove, forming a bump on the barrier metal layer positioned on the electrode portion, and removing the outside barrier metal layer from the stopper. The stopper thus prevents the removal of the inside barrier metal layer during the removal of the outside barrier metal layer.

In the present invention, in order to obtain the function of a barrier metal layer in a bump formation region, a groove is formed by removing at least a part of the barrier metal layer. The barrier metal layer is used to prevent a reaction with a bump and the material positioned therebelow. Three layers of Ti having a thickness of about 1000 Å, Cu having a thickness of about 2 $\mu$m, and Ni having a thickness of about 1000 Å are preferably used as the barrier metal layer. The width of the groove is determined by the etching-proof properties thereof and the required bump size, etc. The width of the groove determines the width of stopper material, and large width of the stopper material increases the stopper function. However, if the width of the stopper is too large, the process of plating the stopper material becomes difficult.

BRIEF DESCRIPTION OF THE DRAWINGS

FIGS. 1A to 1E are cross-sectional views for explaining a conventional method of producing such a semiconductor device;

DESCRIPTION OF THE PREFERRED EMBODIMENTS

FIGS. 2A to 2E are cross-sectional views explaining the steps in a first example of the present invention.

Figure 1A:
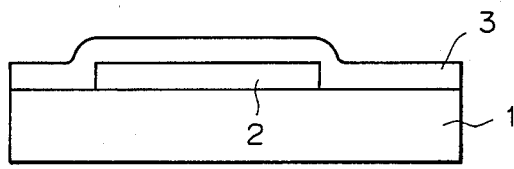
Figure 1B:
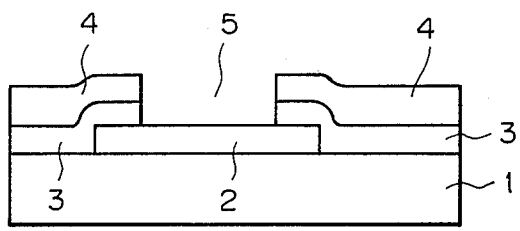
Figure 1C:
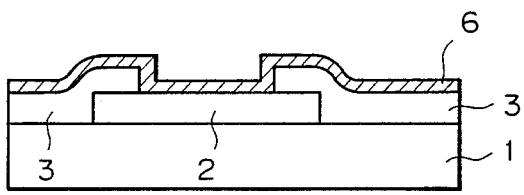
Figure 2A:
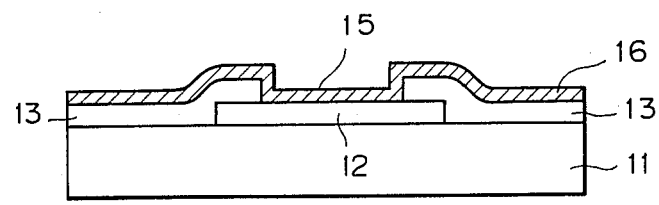
FIGS. 2A to 2E are cross-sectional views explaining the steps in a first example of the present invention.
Figure 2B:
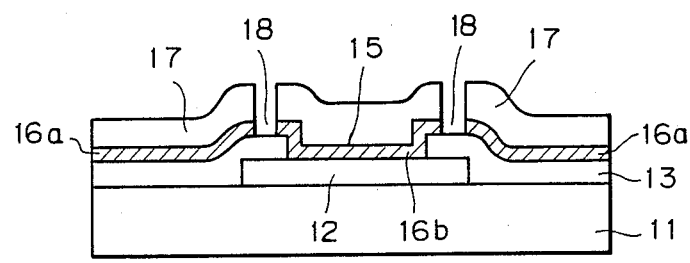

The structure shown in FIG. 2A is formed by the same steps as shown in FIGS. 1A to 1C for producing a conventional semiconductor device. Then, according to the present invention, a second resist film is formed on a barrier metal film 16 and patterned to form a second resist pattern 17 having a groove 18, as shown in FIG. 2B. In FIGS. 2A to 2E, reference numerals 11, 12, 13, and 15 show a semiconductor substrate, an aluminum electrode, a PSG film, and an opening, respectively. The region inside the groove 18 is bump region on which a bump is to be formed, and is hereinafter called a bump formation region.

Figure 3:
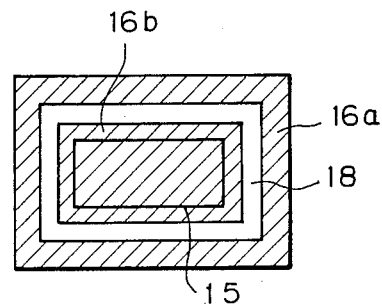
FIG. 3 is a plan view of FIG. 2C.

As shown in FIG. 3, the groove 18 is formed so that it surrounds the bump formation region, and therefore, the barrier metal film 16b in the bump formation region is not electrically connected to the barrier metal film 16a positioned outside the groove 18.

Figure 2C:
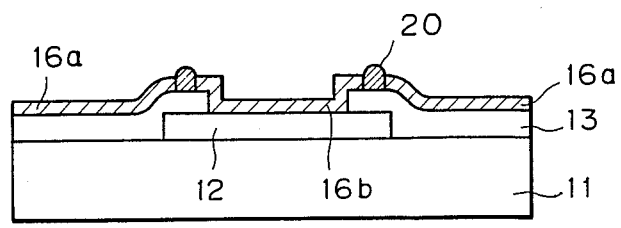
Figure 2D:
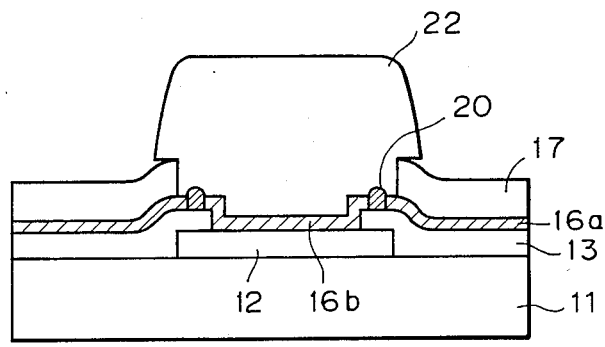

Then, as shown in FIG. 2C, an electroplating process is carried out, using the barrier metal 16a as a cathode, so that, for example, gold (Au) 20, is buried in the groove 11. In the first stage of the electroplating, the deposition of the gold 20 is started from the end of the barrier metal 16a and expanded to reach the barrier metal 16b, so that the barrier metal 16b is connected to the barrier metal 16a. The plating is advanced then expanded to cover the entire cross section of the groove 18. The width of the groove 18 is preferably about 5 μm. A resist pattern 17 is then formed so that the region except for a bump formation region is masked. Then, as shown in FIG. 2D a mushroom-shaped bump 14 is formed on the barrier metal 16b and gold 20 by a plating process.

Figure 2E:
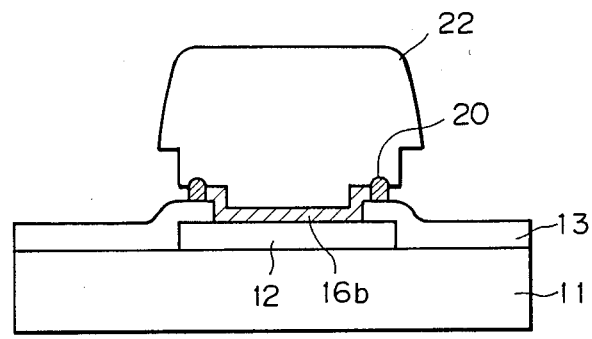

Finally, as shown in FIG. 2E, the resist pattern 14 and the barrier metal 16a are removed by an etching process. During this etching of the barrier metal 16a, although the bump 22 is slightly etched at the side thereof, further etching of the bump 22 is stopped by the gold 20. Namely, the gold 20 acts as a stopper.

Figure 4A:
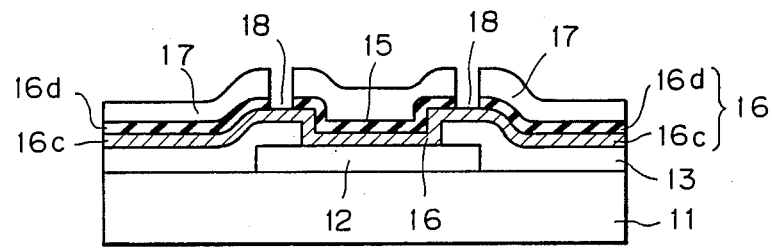
FIGS. 4A. to 4C.
Figure 6:
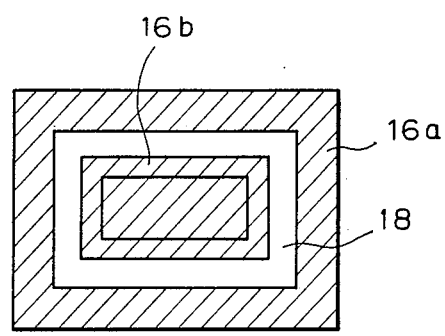
FIG. 6 is a schematic plan view of FIG. 4A.

FIGS. 4A to 4C and FIG. 5 are cross-sectional views explaining the steps in a second and a third example of the present invention, and FIG. 6 is a schematic plan view relating to FIG. 4A.

Figure 4B:
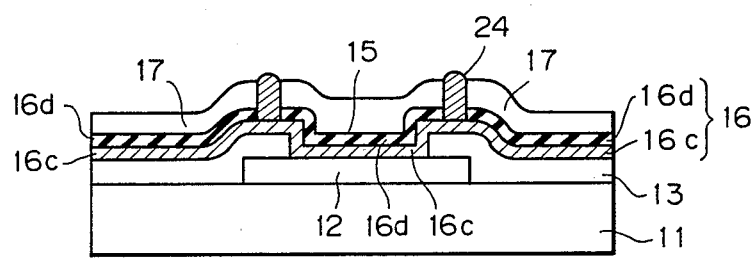
Figure 4C:
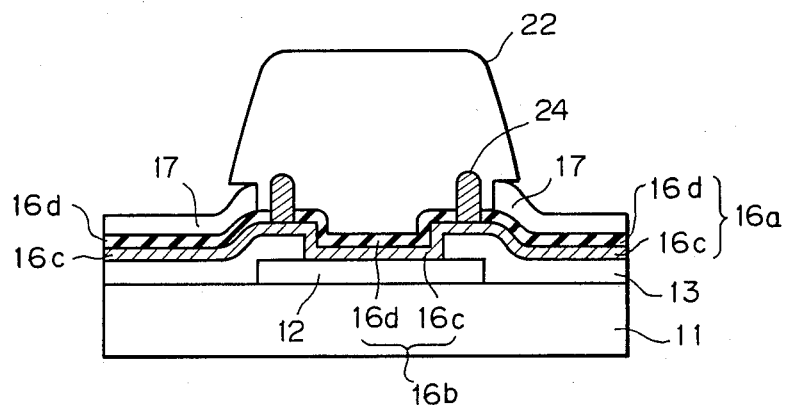
Figure 5:
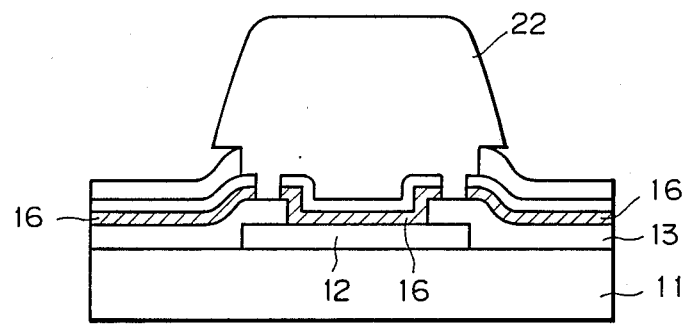
FIG. 5, show cross-sectional views explaining the steps in a second and third example of the present invention.

In the second example as shown in FIGS. 4A to 4C, a part of the barrier metal layer 16 is not etched during the etching of the barrier metal layer 16, so that the remaining barrier metal layer 16 can be used as an electric path.

As shown in FIG. 4A the barrier metal layer 16 is formed by two layers 16c of Ti and 16d of Pd or Ni/Cu.

When a groove is formed by using the resist pattern 17, only the Pd or Ni/Cu layer is removed and the Ti layer remains. Then, as shown in FIG. 4B, a stopper 24 of Au or solder is plated in the groove 18, and as shown in FIG. 4C, a bump 22 is formed by a plating process at a non-masked position. Finally, the resist pattern 17 and the exposed barrier metal 16d and 16c are removed by an etching process. The stopper 24 prevents etching of the inside barrier metal 16 during this process.

Note, the process shown in FIG. 4B may be omitted. Namely, after forming a groove 18 as shown in FIG. 4A, the bump 22 can be plated by using the resist pattern 17 as a mask, since an electric path is formed by the Ti layer 16c. Thus, the bump metal is buried in the groove 18 of the barrier metal 16c and the buried metal acts as a stopper.

FIGS. 7A to 7D show cross-sectional views explaining the steps in a fourth example of the present invention.

In this example, after forming the structure having a groove 18 shown in FIG. 2B, the resist film pattern 17 is removed.

Figure 7A:
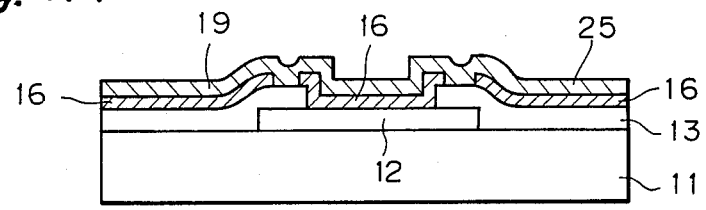
FIGS. 7A to 7D are cross-sectional views explaining the steps in a fourth example of the present invention.
Figure 7B:
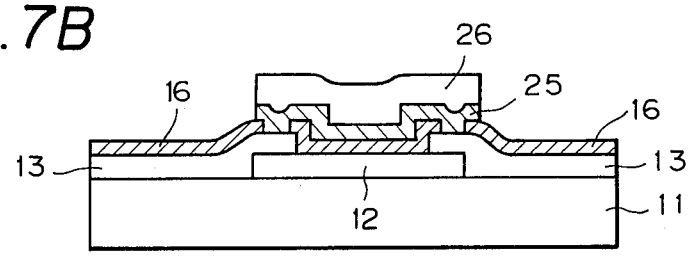

Then as shown in FIG. 7A a solder film 25 about 5 μm thick is formed over the entire surface by a vapour deposition process. Subsequently, as shown in FIG. 7B, a resist pattern film 26 is formed only above the aluminum electrode 12, and the solder film 25 is etched using the resist film pattern 26 as a mask. The etching process is carried out by a wet etching using a mixture of ethylene diamine tetra acetic acid, hydrogen peroxide, and ammonia.

Figure 7C:
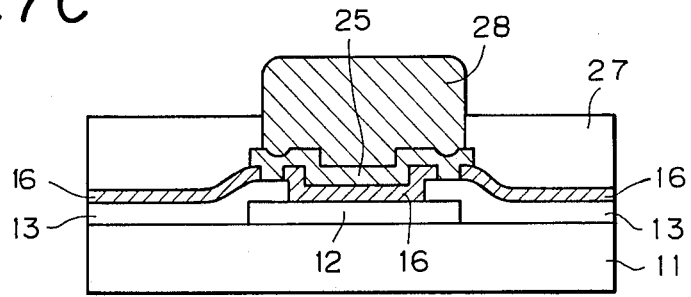

The resist film pattern 26 is then removed, as shown in FIG. 7C, and a resist is formed over the entire surface and patterned to form a resist film pattern 27 in such a way that the opening 15 appears only over the aluminum electrode 12. Then, a solder bump 28 having a thin thickness of about 100 μm is formed on the solder film 25 by plating. In the plating process, the barrier metal film 16 and the solder film 25 are used as conductive layers for the electroplating.

Figure 7D:
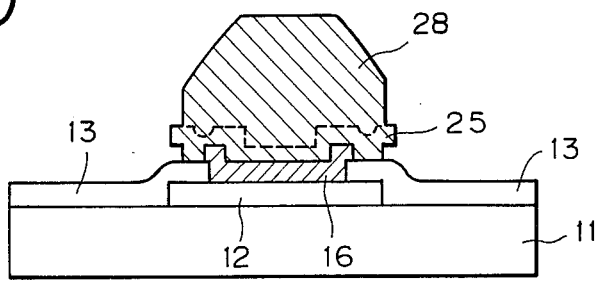
Figure 8:
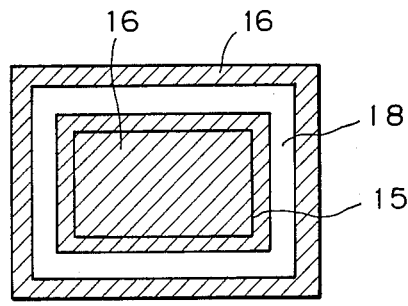
FIG. 8 is a schematic plan view of FIG. 7A.

Then, the resist film pattern 27 is removed, as shown in FIG. 7D, and an exposed barrier metal film 16 is removed by etching. During this etching, the solder film 25 in the groove 18 acts as stopper.

Finally, the structure is heated at 400° C. and the solder bump 22 is completed.

Figure 9A:
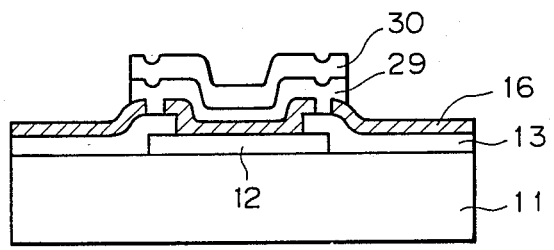
FIGS. 9A to 9B are cross-sectional views explaining the steps in a fifth example of the present invention; and, FIGS. 10A to 10B are cross-sectional views explaining the steps in a sixth example of the present invention.
Figure 9B:
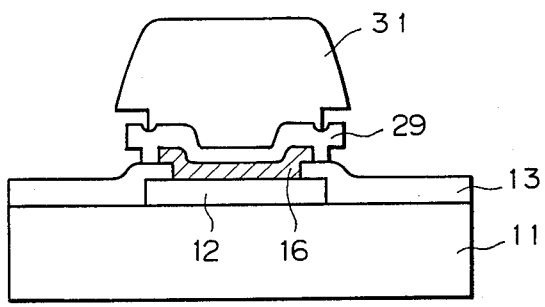

FIGS. 9A and 9B are cross-sectional views explaining the steps in a fifth example of the present invention.

In the fifth example shown in FIGS. 9A and 9B the bump plating is carried out twice. Then as shown in FIG. 2B, after the groove is formed, the resist film pattern 17 is removed.

Figure 10A:
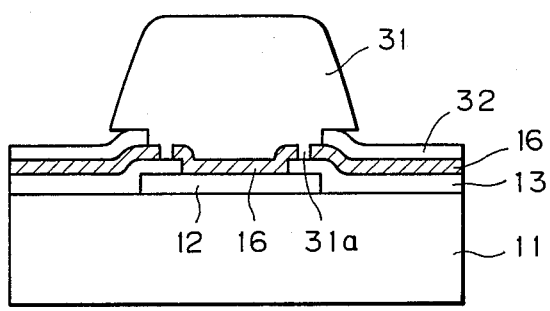

Then, as shown in FIG. 10A, a bump film 29 is formed and patterned so that the bump film 29 is formed only above an aluminum electrode 12, by using a resist 30. Gold may be used as the bump film material. The thickness of the bump film 29 may be very thin if the bump film 29 is to be used as an electric path in the subsequent bump plating process.

Then, as shown in FIG. 9B, the resist 30 is removed and the bump 31 is plated. Since in this plating the entire bump film 29 becomes a cathode, the bump 31 is thickly formed.

Figure 10B:
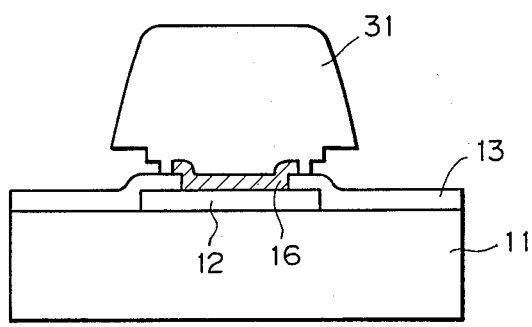

FIGS. 10A to 10B are cross-sectional views explaining the steps in a sixth example of the present invention.

The structure shown in FIG. 2B is formed, and then a resist pattern 32 is formed and a bump 31 is plated as shown in FIG. 10A. The outer end of the barrier metal 16 is surrounded by a leg 31a of the bump 31. Therefore, even if the leg 31a of the bump 31 is slightly melted during the etching of the barrier metal 32, as shown in FIG. 10B, the barrier metal 32 is not etched because the leg 31a acts as a stopper.

I claim:

1. A method for producing a semiconductor device comprising the steps of:

forming an insulating layer on a semiconductor substrate provided with an electrode portion thereon, forming a barrier metal layer over the entire surface thereof, forming a groove in said barrier metal layer so that said groove surrounds said electrode portion, burying a stopper material in said groove, forming a bump on the barrier metal layer positioned on the electrode portion, and removing the barrier metal layer outside of the stopper, said stopper preventing a removal of the inside barrier metal layer during the removal of the outside barrier metal layer.

2. A method according to claim 1, wherein said insulating layer is composed of phospho-silicate glass or silicon dioxide.

3. A method according to claim 1, wherein said electrode portion is composed of aluminum.

4. A method according to claim 1, wherein said barrier metal layer is composed of three layers of titanium, copper and nickel, respectively.

5. A method according to claim 1, wherein said groove is formed by wet-etching the barrier metal layer.

6. A method according to claim 1, wherein said stopper is formed by only fusing gold or solder in said groove.

7. A method according to claim 7, wherein said stopper is formed by the steps of:

forming a bump layer on the barrier metal layer by a plating while burying the groove, and removing the barrier metal layer positioned outside the groove.

8. A method according to claim 1, wherein said stopper is formed by forming a bump, said leg portion of the bump acting as the stopper.

9. A method according to claim 1, wherein said stopper is formed by a plating process.

* * * * *